United States Patent

[11] 3,629,708

[72] Inventor Orville D. Thurnell
St. Charles, Ill.
[21] Appl. No. 858,452
[22] Filed Sept. 16, 1969
[45] Patented Dec. 21, 1971
[73] Assignee Motorola Inc.
Franklin Park, Ill.

[54] VHF-UHF TUNER MECHANISM FOR TELEVISION RECEIVERS

13 Claims, 4 Drawing Figs.

[52] U.S. Cl. ........ 325/461,
325/459, 325/462, 325/464, 325/465
[51] Int. Cl. ........ H04b 1/16
[50] Field of Search ........ 325/459,
461, 462, 464, 465

[56] References Cited

UNITED STATES PATENTS 2,773,987 12/1956 Feigle ........ 325/462
2,839,936 6/1958 Dawson ........ 325/464
3,327,221 6/1967 Rieth ........ 325/459

*Primary Examiner*—Robert L. Griffin
*Assistant Examiner*—Albert J. Mayer
*Attorney*—Mueller, Aichele & Rauner ABSTRACT: A tuner control mechanism for a television receiver capable of operation in the VHF and UHF bands of frequencies includes a conventional VHF tuner mounted on a common shaft with a turret of radially extending linear potentiometers for each of the detented positions of the VHF tuner. The linear potentiometers are used to provide a tuning voltage for a varactor tuned UHF tuner, and a band select switch is located for operation by a rotary cam which is rotated with the VHF and UHF tuner elements in order to effect selection of the band of frequency to which the television receiver is to be tuned for each detented position of the mechanism.

INVENTOR.
ORVILLE D. THURNELL
BY Mueller, Aichele & Rauner
ATTORNEYS.

INVENTOR.
ORVILLE D. THURNELL
BY Mueller, Aichele & Rauner
ATTORNEYS.

VHF–UHF TUNER MECHANISM FOR TELEVISION RECEIVERS

BACKGROUND OF THE INVENTION

Television receivers currently being manufactured for consumer use are capable of operation in either the VHF (very high frequency) or UHF (ultra high frequency) bands of frequencies. In order to provide this capability, however, it is necessary to include two separate tuners or tuning circuits in the television receiver with one of these circuits being utilized for VHF reception and the other being used for UHF reception. The VHF tuner conventionally is a turret type of tuner having 13 detented positions which accomplish the coarse tuning or channel selection of the VHF tuner and a separate control is provided to effect the fine tuning at each of the channel positions. UHF tuners generally employ a separate pushbutton control mechanism or a tuning knob and use a dial indicator of a type commonly found in manual radio receivers. The use of two separate tuning control mechanisms in order to effect the VHF and UHF tuning of the receiver is inconvenient at best; and when a receiver is provided with remote control capabilities, generally only the VHF band of frequencies may be remote controlled and the UHF channels still must be selected manually at the receiving set location.

The use of voltage-variable diode capacitors, such as varactor diodes, permits the electronic tuning of radio and television receivers by the use of a direct current control voltage; so that the tuning elements no longer need to be intimately associated with the tuner itself. Thus, it is possible to locate the tuned circuits of the receivers remotely from the devices which are used to provide the necessary direct current tuning voltages. In addition, the compact size of the voltage-variable diode capacitor tuning circuits makes it desirable to use such tuning circuits in many applications which formerly used mechanically adjusted variable capacitors or the like as a tuning element.

To use voltage-variable diode capacitors in a television receiver, however, creates a problem in providing a "memory" for preselected stations, so that the operation of the tuner may be readily controlled by operation of a pushbutton or a detented rotary tuning mechanism of the type commonly employed in television receivers. In addition, it is desirable to provide a means for effecting detented tuning of the UHF as well as the VHF channels, so that the channels in either band of frequencies may be readily selected with equal ease. The problem is compounded, however, because of the large number of possible UHF channels which exist, on the order of 70 channels, so that to provide detent tuning of all of these possible channels is very difficult. Within any given receiver location, however, only a small number of this possible number of UHF channels actually are utilized; so that a means for preselecting the UHF channels in a given receiver location and storing the tuning information for these preselected UHF channels in a tuner which readily may be switched from one to the other of these channels or to the VHF channels in the same receiver location is desirable.

SUMMARY OF THE INVENTION

Accordingly, it is an object of this invention to provide an improved VHF/UHF television tuning mechanism.

It is an additional object of this invention to provide a tuner control mechanism in which the UHF and VHF channels at a given receiver location may be readily tuned with equal ease once an initial tuning adjustment of the tuning elements is made.

It is a further object of this invention to provide a tuning mechanism for a television tuner in which the UHF channel selection is effected by tuning control elements which are moved and detented simultaneously with the VHF tuner position, and wherein a band selection switch is operated to effect selection of either the VHF or UHF tuner for each detented position.

In accordance with a preferred embodiment of this invention a tuner control mechanism for a television receiver capable of operation in the VHF and UHF bands of frequency includes a VHF tuner having a plurality of discrete tuning positions and a UHF tuner control means having the same plurality of discrete tuning positions, with provision for simultaneously changing the tuning positions of the VHF and UHF tuner devices from one discrete position to another. A band select switch is operated by a camming means having a camming surface for each of the discrete positions of the tuning mechanisms for selecting which one of the tuning mechanisms controls the receiver at each of the discrete positions. A provision is made for adjusting the tuners at at least one of the discrete positions in order to control the tuning of the receiver which is effected by the tuning device at that position.

DETAILED DESCRIPTION

Figure 1:
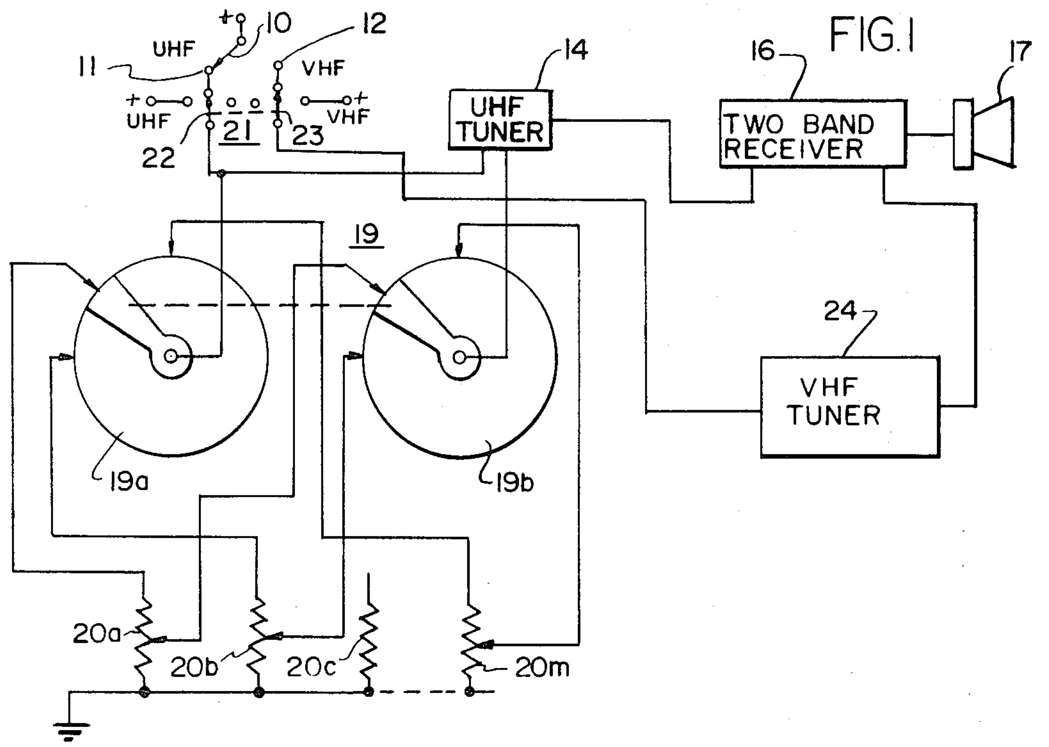
FIG. 1 is a schematic diagram of a two-band television receiver tuning control circuit in accordance with a preferred embodiment of this invention.

Referring now to the drawings, wherein like reference numerals are used throughout the several views to designate the same or similar elements, there is shown in FIG. 1 a circuit which may be utilized in conjunction with a multiband (VHF–UHF) television receiver of the type employing voltage responsive devices, such as varactor diodes in at least the UHF tuning circuits thereof. The circuit shown in FIG. 1 provides predetermined tuning voltages to the electronic tuning circuits of the UHF tuner and also provides for the selective energization of either the UHF tuner or the VHF tuner in the receiver.

As shown in FIG. 1, a source of positive direct current operating potential is connected to the movable contact 10 of a band select switch, with the movable contact 10 being movable to a UHF contact 11 or a VHF contact 12 to energize the corresponding one of the tuners in the television receiver. In FIG. 1 the movable contact 10 is shown engaging the fixed contact 11 to cause the receiver to be responsive to UHF signals, by providing a positive operating potential through the UHF contact 10 to a UHF tuner 14, the output of which then controls the operation of a two-band television receiver 16. The television receiver 16 may be a conventional black and white or color television receiver including the appropriate video- and audio-processing circuits and having the video output reproduced on a cathode ray tube 17.

The setting of the movable contact 10 of the band select switch to the UHF position also causes a direct current potential to be applied to the common terminal or wiper of the first bank **19*a* of a two-bank, 13-position rotary switch 19. The wipers of the two banks 19*a* and 19*b* of the rotary switch 19 are mechanically interconnected to move together and make an electrical contact between the common terminals for each of the banks and a selected one of 13 fixed contacts associated with each of the 13 positions to which the switch may be rotated for each of the banks 19*a* and 19*b***.

FIG. 1, the wiper of bank **19*a* is shown completing an electrical connection to a terminal connected to one end of a potentiometer 20*a*, the other end of which is connected to ground, and the tap of which is connected to a corresponding terminal in electrical contact with the wiper of the bank 19*b*. The common terminal of the bank 19*b* then is connected to the UHF tuner 14 to supply the desired tuning voltage to the tuner 14**, which may be a varactor diode electronically controlled tuning circuit of a known type. The output of the UHF tuner 14 then controls the tuning of the television receiver 16 to select the desired channel to be reproduced by the television receiver. Different positions of the rotary switch 19 cause different ones of 13 potentiometers or tuning elements 20*a* to 20*m* to be connected to the common terminal of the switch bank 19*b* to apply different potentials to the UHF tuner 14 in accordance with the selected settings of the potentiometers.

In FIG. 1 only four potentiometers 20*a*, 20*b*, 20*c* and 20*m* have been indicated, with only the potentiometers 20*a*, 20*b* and 20*m* having completed electrical connections shown. This has been done in order to avoid unnecessarily cluttering the drawing by showing all 13 potentiometers along with the 13 leads interconnecting the potentiometers to the switch banks 19*a* and 19*b*.

With the movable contact 10 of the band select switch placed in the VHF position, breaking the circuit through the stationery contact 11 and completing an electrical circuit from the source of positive potential through the stationery contact 12 to a VHF tuner 24, no operating potential for the UHF tuner 14 is provided; and the VHF tuner 24 controls the tuning of the television receiver 16. When the band select switch 10 is in the UHF position, completing the circuit through the contact 11, no operating potential is applied to the VHF tuner 24 so that only UHF tuner 14 controls the operation of the tuning of the television receiver 16. Thus, the band select switch determines which one of the tuners 14 or 24 is used to tune the receiver 16.

In order to override the selection of the tuner effected by the band select switch 10, 11, 12, an additional override switch 21 has been provided with a pair of ganged movable contacts 22 and 23 which may be moved to any of three different positions. As shown in FIG. 1, the override switch 21 is in its center position, with the contacts 22 and 23 being connected respectively to the stationary contacts 11 and 12 of the band select switch. When it is desired to override the tuner selection provided by the band select switch and cause only the UHF to be energized, irrespective of the operation or position of the band select switch, the movable contacts 22 and 23 are moved to either of the other two positions.

With the contacts 22 and 23 moved to the left position, as shown in FIG. 1, a positive potential is applied through the contact 22 to the UHF tuner 14. In the left position, the contact 23 is connected to an open circuit so that no energizing potential is supplied to the VHF tuner 24. When it is desired to cause the VHF tuner 24 to be energized irrespective of the position of the band select switch, the override switch is moved to its right position, causing a positive operating potential to be applied through the movable contact 23 to the VHF tuner 24. In this position, the contact 22 is connected to an open circuit so that the UHF tuner 14 is not energized.

In the foregoing description, the operation of the rotary switch 19 indicated that the wipers of the switch banks 19*a* and 19*b* moved relative to fixed terminals connected to the potentiometers 20*a* to 20*m*. It should be noted, however, that the wipers could occupy a fixed position and that the potentiometers and the terminals connected thereto can be rotated to provide the same results. This latter mode of operation is the one which is used in the mechanism to be described hereinafter.

Figure 2:
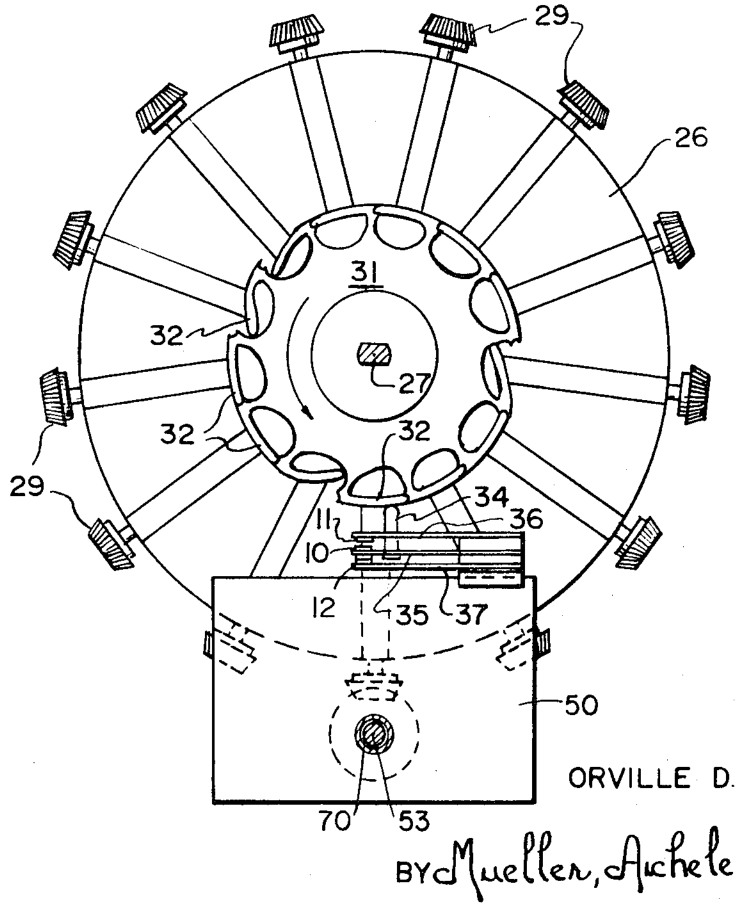
FIG. 2 is an end view of the tuning control mechanism used to control the operation of one of the tuners shown in the circuit of FIG. 1.
Figure 3:
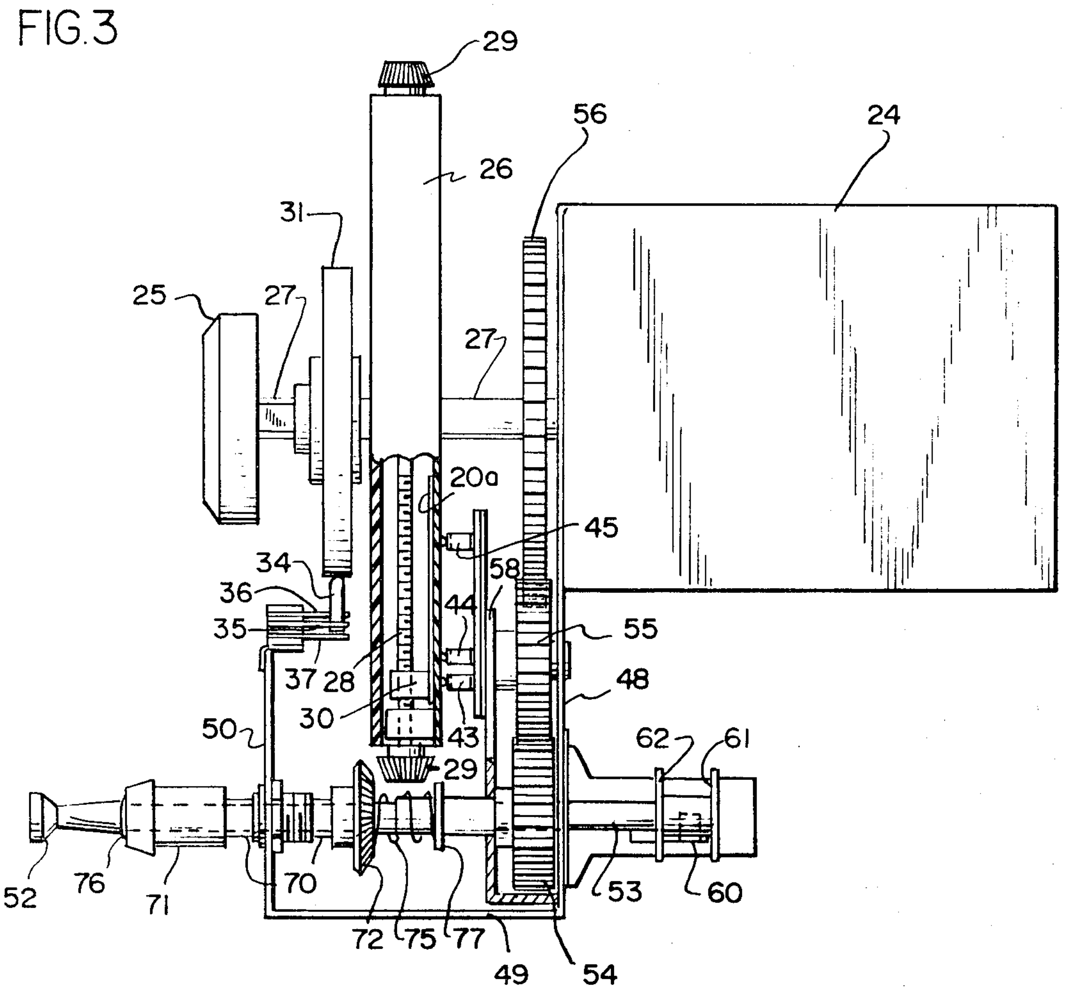
FIG. 3 is a partially cutaway side view of the tuning control mechanism shown in part in FIG. 2.
Figure 4:
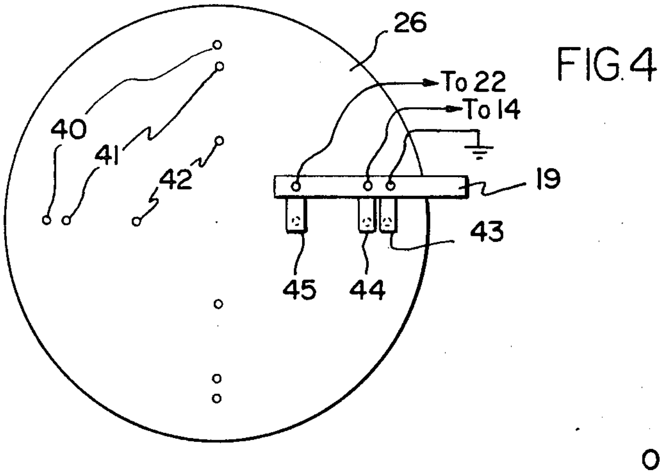
FIG. 4 is a rear view of a portion of the tuner control mechanism shown in FIG. 2.

In FIGS. 2, 3 and 4 there is shown a mechanism which may be used to select and adjust the settings of the potentiometers 20*a* to 20*m* associated with the UHF tuner 14 and to control the channel selection of the VHF tuner 24. The potentiometers 20*a*–20*m* for controlling the UHF tuner 14 are enclosed in a radial housing or assembly 26, as best seen in FIG. 2, with 13 linear potentiometers being located at equal angular distances about the axis of a shaft 27 passing through the center of the housing. The housing is attached to the shaft 27 for rotation therewith.

In FIG. 3 the control mechanism for one of the linear potentiometers 20 is shown and includes a lead screw 28 which is used to vary the position of a follower member 30 for the potentiometer 20. The position of the follower 30 varies the position of the movable tap of the potentiometer 20 to cause varying amounts of direct current potential to be applied from the tap of the potentiometer 20 and through the bank 19*b* of the rotary switch 19 to the UHF tuner 14. In order to effect rotational adjustment of the lead screw 28 and thereby to position the follower 30 controlling the tap location of each of the potentiometers 20*a* to 20*m*, a bevel gear 29 is connected to the end of the lead screws 28 for each of the 13 potentiometers as most clearly shown in FIG. 2. Engagement and rotation of a bevel gear 29 then effects rotation of the lead screw 28 controlled thereby to position the follower 30, and thus the tap of the potentiometer 20*a*–20*m* being adjusted. This adjustment may be effected at a preselected or single rotational position of the UHF tuner control assembly 26, and in FIGS. 2 and 3 this position is shown as the lowermost position of the control assembly 26. Thus, for each different rotational position of the UHF tuner control assembly 26, a different one of the 13 potentiometer bevel gears 29 is rotated to the position where it may be rotated to effect the tuning adjustment of the associated potentiometer.

The UHF tuner control assembly 26 is attached to the channel selection control shaft 27 which also is used to select the rotational position of the tuning elements of the VHF tuner 24 by rotation of a channel selection knob 25 connected to the end of the shaft 27. Thus, the detented locations of the VHF tuner 24 and the UHF tuner control assembly 26 both are established by the detent positions of the VHF tuner 24.

At each of the detented positions to which the VHF tuner 24 and the UHF tuner control assembly 26 may be located by rotation of the channel selection knob 25, it is possible to select either the VHF tuner 24 or the UHF tuner control assembly 26, and thus the UHF tuner 14, to control the tuning of the television receiver 16. This control is obtained through the band select switch 10, 11, 12 with the movable contact 10 of the band select switch being moved to engage either the contact 11 for the UHF channels or the contact 12 for the VHF channels under the control of a programmable cam 31.

The programmable cam 31 has a movable tab or cam surface 32 for each of the 13 positions of the tuner 24 and tuner control assembly 26 and is mounted on the shaft 27 with the tuner 24 and tuner control assembly 26 for rotation under control assembly 26 for rotation under control of the channel selection knob 25. As shown in FIG. 2, the movable contact 10 of the band select switch is connected to a cam follower 34 which rides on the cam surfaces 32 of the programmable cam 31. The cam follower 34 is biased into engagement with the cam surfaces 32 by a leaf spring member 35. The contacts 11 and 12 also are mounted on cantilever leaf spring members 36 and 37, respectively, in substantially parallel alignment with the spring member 35.

In FIG. 2, the movable cam surface 32 engaged by the follower 34 is in its outermost position; so that the cam follower 34 causes the movable contact 10 to engage the stationary contact 12 resulting in the selection of the VHF tuner 24 for the rotational position of the mechanism shown in FIG. 2. Rotation of the shaft 27 in a counterclockwise direction to the next detented position, however, causes the adjustable cam surface 32 located to the left of the lowermost surface 32 shown in FIG. 2 to be rotated opposite the cam follower 34. The cam follower 34 then moves upwardly into the opening caused by this next lowered surface 32 to engage the movable contact 10 with the stationary contact 11 to select the UHF tuner for this next rotational position of the shaft 27. It is apparent that the setting of the movable cam surfaces 32 at each of the discrete detented positions to which the tuner 24 and tuner control assembly 26 may be rotated effects automatic selection of either the VHF tuner 24 or the UHF tuner 14 for each position. Of course the operation of the switch 10, 11, 12, under the control of the programmable cam 31 may be overridden by the operation of the override switch 26 which previously has been described.

Referring now to FIG. 4 there is shown a back view of the UHF tuner control assembly 26, switch 19 which is used to provide the positive and ground potentials to the potentiometers located in the housing 26, and to provide an output from the movable tap of the potentiometers. The back of the housing 26 preferably is made of a nonconductive material; and in conjunction with each discrete position to which the housing may be rotated, includes three conductive terminals or rivets 40, 41 and 42 extending through the housing and being connected to the two ends and the center tap, respectively, of each of the potentiometers located at the corresponding position. These contacts 40, 41 and 42, have been shown for only four positions or potentiometers in FIG. 4 in order to avoid unnecessary cluttering of the drawing.

The contacts 40 are all aligned in a circle to make contact with a brush or wiper 43 on the switch 19. The brush 43 and the contacts 40 may be used to provide the ground potential to the potentiometers shown in FIG. 1. At a lesser radial distance from the axis of the tuner control assembly 26, the contacts 41 are located and are aligned with a brush 44 which may be used to provide the output from the movable tap of the potentiometers, with the brush 44 corresponding to the wiper of section 19*b* shown in FIG. 1. Finally, the contacts 42 are located on a circle which is nearest the axis of the tuner control assembly housing 26, with the contacts 42 being aligned with a wiper or brush 45 to provide the B+ potential to the potentiometers 20*a*–20*bh*, with the wiper 45 corresponding to the wiper of the switch section 19*a* shown in FIG. 1. These connections between the brushes 43, 44 and 45 of the switch 19 and the contacts 40, 41 and 42 of a potentiometer are made with the potentiometer 20*a*–20*m* which is rotated to the lowermost position as shown in FIGS. 2 and 4. This lowermost position may be considered to be the selected position for a given channel to be received under the control of the UHF tuner 14 by the television receiver 16.

Refer now to FIG. 3 which most clearly shows the structural details of the tuner assembly. The VHF tuner 24 is mounted on the upright right end 48 of a U-shaped frame member having a bottom 49 and an upright left end 50. The control shaft 27 for rotating the tuning elements of the VHF tuner 24 and for rotating the UHF tuner control assembly 26, is passed through an opening in the frame end 48; so that the frame end 48 having the housing of the VHF tuner 24 firmly attached thereto, provides support, by means of the shaft 27, for the UHF tuner control assembly 26, the programmable cam 31, and the channel selection knob 25. The conventional detent mechanism of the VHF tuner 24 provides the 13 different positions to which the tuning elements of the VHF tuner 24 and the UHF tuner control assembly 26 may be positioned by the channel selection knob 25.

As shown in FIG. 3 the linear potentiometer 20*a* of the UHF tuner control assembly 26 is located in the position for providing the tuning output potential to the UHF tuner 14, if the programmable cam 31 or the override switch 26 is used to effect selection of the UHF tuner 14 and tuner control assembly 26 for that position. Thus, the pickup brushes 43, 44 and 45 of the switch 19 engage the contacts 40, 41 and 42, respectively, attached to the linear potentiometer 20*a*.

In order to effect fine tuning of the VHF channel selected by the VHF tuning element rotated into position by the channel selection knob 25, a VHF fine tuning knob 52 is provided and operates through a VHF control shaft 53 to rotate a spur gear 54 which in turn rotates a VHF fine tuning control gear 56 through an idler gear 55, which is mounted for rotation between the frame end 48 and inner upright frame member 58. The VHF tuner 24 preferably is of the type in which fine tuning of the selected channel is effected by the rotation of the control gear 56 with the first few degrees of rotation of the gear 56 in either direction causing the fine tuning control gears located within the tuner to engage the tuning mechanism to tune the tuning elements rotated to the control position of the tuner used to select the desired channel. The fine tuning mechanism is disengaged when the channel selection knob 25 is rotated to a different detented position. This type of "turn to engage" VHF fine tuning control is conventional, so that details have not been shown in the drawing.

In addition to providing control of the fine tuning of the VHF tuner elements in the tuner 24 the VHF fine tuning knob may be pulled out or toward the left to control the operation of a conventional automatic frequency control (AFC) switch 60. The switch 60 includes control lever located between a pair of flanges 61 and 62 which are mounted on and carried by the VHF control shaft 53 for movement therewith. When the VHF fine tuning knob 52 is moved toward the left, the flange 61 engages the switch 60 to move the control lever toward the left, disabling the AFC circuit; and when the VHF fine tune control knob 52 is pushed in toward the right, the flange 62 engages the control lever to move it toward the right as viewed in FIG. 2 to enable the AFC circuit.

The manner in which the AFC switch 60 is used to switch the AFC circuit into and out of operation during adjustment of the fine tuning control of the VHF tuner 24 is conventional.

In order to establish detented channel selection of different UHF channels, it is necessary to adjust the taps on the linear potentiometers 20*a*–20*m* which are connected through the switch 19 when each of the potentiometers is in the position shown in FIG. 3 for the potentiometer 20*a*. A UHF control shaft 70 is concentrically mounted over the VHF control shaft 53 and passes through an opening in the frame end 50. Rotation of the UHF control shaft 70 is accomplished under control of a UHF tuning knob 71, which also is concentrically mounted for rotation about the shaft 53. The inner end of the UHF control shaft 70 terminates in a bevel gear 72 which is arranged to mate with the bevel gear 29 on the linear potentiometer 20*a*–20*m* positioned in the lowermost vertical position by rotation of the channel selection knob 25. The UHF control shaft 70 and bevel gear 72 are biased by a compression coil spring 75 toward the left, with the spring being compressed between a flange 77, secured to the shaft 53, and the bevel gear 72 to cause the shaft 70 to push the UHF tuning knob 71 against a flange 76 on the VHF fine tuning knob 52. Thus, the bevel gear 72 is biased out of engagement with the corresponding bevel gear 29 connected to the lead screw 28 of the linear potentiometer 20*a*–20*m* in the selected position.

When it is desired to adjust the position of the tuning follower 30 to locate the tap of the potentiometer 20*a* (or any potentiometer located in the position shown in FIG. 3) to effect tuning of the UHF tuner 14 the UHF fine tuning knob 71 is pushed inwardly toward the right, as viewed in FIG. 3, against the action of the spring 75. This causes the bevel gear 72 to engage the corresponding bevel gear 29, so that rotation of the knob 71 causes rotation of the control shaft 70 and the bevel gear 72 to rotate the gear 29 and the lead screw 28, moving the tuning follower 30 accordingly. When the desired channel is tuned by the positioning of the tap on the potentiometer 20 by movement of the tuning follower 30, the UHF tuning knob 71 is released whereupon it is biased into the nonengaged position shown in FIG. 3.

Each time that the UHF tuner control assembly 26 is then thereafter rotated to the position shown in FIG. 3, the potentiometer 20*a* provides the same predetermined preset tuning voltage to the UHF tuner 14 to select the same channel. Each of the 13 different potentiometers in the UHF tuner control assembly 26 can be present in accordance with the abovementioned technique to cause a different UHF channel to be selected for each of the 13 different possible detented positions of the UHF tuner control assembly 26.

By appropriate setting of the cam surfaces 32 in the programmable cam 31, it is possible to cause automatic selection of either the UHF tuner 14 under control of the UHF tuner control assembly 26 or the VHF tuner 24 for each of the 13 different discrete detented positions to which the composite assembly can be rotated by the channel selection knob 25. Since in any given location in which a receiver may be operated there are less than 13 VHF or less than 13 UHF channels, the programmable cam 31 can be set to cause a UHF channel selection at any position where no VHF channel is present. The appropriate setting of the potentiometer tap of the potentiometer located for that setting of the channel selection knob 25 then can be used to select any one of the UHF channels which also are being transmitted in the location in which the receiver is to be used.

In the event that it is desirable to utilize the full 26-channel potential provided by the assembly shown in the drawings, the manual override switch 21 can be used to select a VHF or a UHF channel for each of the 13 detented positions which may be selected by rotation of the channel selection knob 25. In the event that such overriding of the automatic selection effected by the band select switch and the programmable cam 31 is not desired, the manual override switch 21 can be eliminated, with the band select switch being wired to the input leads to the tuners 14 and 24 as shown in FIG. 1. On the other hand, if the automatic channel selection effected by the programmable cam 31 and the band select switch 10, 11, 12 is not desired, these elements can be eliminated and the switch 21 can be utilized in order to select the VHF or UHF channels as desired.

The apparatus described above and shown in the drawings provides a means whereby, after an initial setting of the UHF potentiometers, selection of a UHF channel may be made as effortlessly as selection of a VHF channel. In addition, the system enables remote control selection of all of the channels by use of the conventional remote control mechanisms which presently provide remote control only of the VHF channels of the television receiver.

I claim:

1. In a television receiver capable of operation in at least the VHF and UHF bands of frequency, a tuner control apparatus including in combination:
   - a tuner control shaft;
   - VHF tuner means mounted for rotation with the tuner control shaft and having a predetermined number of adjustable tuning elements located at different rotary positions about the tuner control shaft;
   - UHF tuner means mounted for rotation with the tuner control shaft and having a predetermined number of adjustable tuning elements located at different predetermined positions about the tuner control shaft;
   - means for rotating the tuner control shaft to simultaneously change the rotary positions of the VHF and UHF tuner means to cause different ones of the tuning elements of the UHF and VHF tuner means to be located at predetermined fixed locations for controlling the outputs obtained from the respective tuner means;
   - a band select switch for selecting one of the tuner means for controlling the tuning of the television receiver;
   - camming means for rotation with the tuner control shaft to operate the band select switch for selecting said one of the tuner means;
   - first and second concentric rotatably mounted tuning element adjusting shafts located at a predetermined fixed position relative to the tuner control shaft;
   - first adjusting means attached to the first turning control shaft for engagement with an adjustable tuning element of the VHF tuner means rotated adjacent said fixed position; and
   - second adjusting means attached to the second concentric shaft for engagement with an adjustable tuning element of the UHF tuner means rotated adjacent said fixed position.

2. The combination according to claim 1 wherein the camming means have a predetermined number of cam surfaces corresponding to the number of rotary positions of the VHF and UHF tuner means, with the band select switch being operated under control of the cam surfaces, and with the cam surfaces being changed simultaneously with changes in the tuning positions of the VHF and UHF tuner means.

3. The combination according to claim 2 wherein the VHF and UHF tuner means are rotary tuner means mounted on the tuner control shaft, and wherein the camming means is a rotary cam mounted for rotation on the tuner control shaft, and further including means for obtaining an output from the tuning means at a predetermined rotational position thereof wherein the band select switch is located to correspond to that predetermined rotational position for operation by the camming means.

4. In a television receiver capable of operation in at least the VHF and UHF bands of frequency, a tuner control apparatus including in combination:
   - a tuner shaft;
   - VHF tuner means having a predetermined number of tuning elements located at different rotary positions about the tuner shaft;
   - UHF tuner means having a predetermined number of tuning elements located at different predetermined rotary positions about the tuner shaft;
   - means for rotating the shaft to simultaneously change the rotary positions of the VHF and UHF tuning elements to cause different ones of the tuning elements of the UHF and VHF tuner means to be located at predetermined fixed locations for controlling the outputs obtained from the respective tuner means;
   - a band select switch for selecting one of the tuner means for controlling the tuning of the television receiver;
   - camming means mounted for rotation with the VHF and UHF tuner means to operate the band select switch for selecting said one of the tuning means.

5. The combination according to claim 4 further including overriding switch means connected in circuit with the band select switch for selecting one of the VHF or UHF tuner means for controlling the tuning of the television receiver irrespective of the operation of the band select switch effected by the camming means and wherein the VHF tuner means, the UHF tuner means, and the camming means all are mounted on the tuner shaft for simultaneous rotation.

6. The combination according to claim 4 wherein the band select switch is controlled by a cam follower engaging the surface of the camming means and the camming means is a programmable cam having an individual cam surface corresponding to each of said tuning positions, with each cam surface being adjustable to either one of two positions to effect selection of the VHF or UHF tuner means at each position of rotation thereof.

7. In a television receiver capable of operation in at least the VHF and UHF bands of frequency, a tuner control apparatus including in combination;
   - a rotary VHF tuner means having a predetermined number of tuning elements each being arranged for rotation to a first preselected position so that the tuning element rotated to the preselected position is effective to control the tuning of the VHF tuner means;
   - a UHF tuner means having at least said predetermined number of tuning elements each being arranged for rotation to a second preselected position so that control of the UHF tuner means is effected by the tuning element rotated to the second preselected position;
   - means for simultaneously rotating the tuning elements of the VHF and UHF tuner means to locate different ones of the tuning elements of said respective tuner means at the first and second preselected positions;
   - rotary cam means mounted for rotation with the VHF and UHF tuner means and having camming surfaces corresponding to said predetermined number of tuning elements;
   - a band select switch means having a cam follower located for operation by the camming surfaces, with the cam follower operating the band select switch to select the VHF or UHF tuner means for controlling the band of operation of the television receiver; and
   - means corresponding to the first and second preselected positions of the VHF and UHF tuner means for adjusting the tuning elements of the VHF and UHF tuner means located at said first and second preselected positions, respectively.

8. The combination according to claim 7 wherein the tuning elements of at least the UHF tuner are adjustable potentiometers and further including additional switch means corresponding to said second preselected position for obtaining the output of the potentiometer of the UHF tuner means at said second preselected position.

9. The combination according to claim 8 wherein the potentiometers are linear potentiometers mounted within a disc-shaped housing and arranged with the lengths thereof extending radially from the center of rotation of the UHF tuner housing, potentiometer adjusting means for each of the potentiometers being located on the outside circumference of the disc and being located for engagement with the tuning element adjusting means at said second preselected position.

10. The combination according to claim 9 wherein the first and second preselected positions are the same.

11. The combination according to claim 10 wherein the tuning element adjusting means includes first means for adjusting the VHF tuning elements by adjusting the fine tuning thereof and includes second means for adjusting the UHF tuning elements by moving the tap on each of the linear potentiometers, with the first and second adjusting means being concentrically mounted on a common shaft.

12. The combination according to claim 11 wherein the VHF tuner means, the UHF tuner means and the cam means all are mounted for simultaneous rotation on a single shaft.

13. The combination according to claim 13 wherein the camming means is a programmable cam, having cam surfaces settable to one of two heights at each rotational position of the UHF and VHF tuner means so that a cam surface of one height causes the band select switch to select the VHF tuner means and a cam surface at the other height causes the band select switch means to select the UHF tuner means.

* * * * *